US 8,448,814 B2

(12) United States Patent
Yamamoto et al.

(10) Patent No.: US 8,448,814 B2
(45) Date of Patent: May 28, 2013

(54) FIT STRUCTURE OF A HOUSING

(75) Inventors: Ritsu Yamamoto, Kyotanabe (JP);
Masahiro Ito, Ise (JP); Motoharu Kubo, Obihiro (JP)

(73) Assignee: Panasonic Corporation, Kadoma-shi (JP)

( * ) Notice: Subject to any disclaimer, the term of this patent is extended or adjusted under 35 U.S.C. 154(b) by 436 days.

(21) Appl. No.: 12/308,469

(22) PCT Filed: Oct. 11, 2007

(86) PCT No.: PCT/JP2007/069839
§ 371 (c)(1),
(2), (4) Date: Dec. 16, 2008

(87) PCT Pub. No.: WO2008/044730
PCT Pub. Date: Apr. 17, 2008

(65) Prior Publication Data
US 2010/0270305 A1    Oct. 28, 2010

(30) Foreign Application Priority Data

Oct. 13, 2006  (JP) ................................ 2006-280660

(51) Int. Cl.
*B65D 41/16*    (2006.01)
(52) U.S. Cl.
USPC ............ 220/788; 220/315; 220/786; 403/345
(58) Field of Classification Search
USPC .............. 220/788, 315, 324, 786, 790, 309.2;
403/345; 215/224, 273, 280
See application file for complete search history.

(56) References Cited

U.S. PATENT DOCUMENTS

| 4,252,248 | A | * | 2/1981 | Obrist et al. ................. 220/270 |
| 4,840,286 | A | | 6/1989 | Heberling et al. |
| 5,348,549 | A | * | 9/1994 | Brown et al. ................. 604/403 |
| 5,383,098 | A | | 1/1995 | Ma et al. |
| 5,574,254 | A | | 11/1996 | Mori et al. |
| 5,613,616 | A | | 3/1997 | Monus |
| 5,979,691 | A | * | 11/1999 | Von Holdt ................. 220/266 |
| 2007/0095838 | A1 | * | 5/2007 | Roesler ................. 220/326 |

FOREIGN PATENT DOCUMENTS

JP    60-110241 U    7/1985
JP    3-45846 U    4/1991
(Continued)

OTHER PUBLICATIONS

Office Action dated Jul. 7, 2010, issued for the Chinese Patent Application No. 200780028331.4 and English translation thereof.
(Continued)

*Primary Examiner* — Mickey Yu
*Assistant Examiner* — Kareen Rush
(74) *Attorney, Agent, or Firm* — Edwards Wildman Palmer LLP; James E. Armstrong, IV; George N. Chaclas

(57) ABSTRACT

Fit structure of a housing formed of first and second halves is provided. The first half has a fit projection piece having a fit tongue at the tip. The second half has a presser part and an engaging piece constituting a fit groove. The fit projection piece, presser part and engaging piece are formed so that the fit tongue is positioned in the inner part of the fit groove along the root of the presser part. The housing further has a nail stuck out in an inward or outward direction of the housing and a nail holder engaged with the nail. The nail and nail holder are located at one and the other of a part of the fit projection piece and a corresponding part of the engaging piece. The part of the fit projection piece is nearer to the root of the fit projection piece than the fit tongue.

3 Claims, 14 Drawing Sheets

FOREIGN PATENT DOCUMENTS

| | | |
|---|---|---|
| JP | 5-67053 | 9/1993 |
| JP | 10-023563 | 1/1998 |
| JP | 2004-312839 | 11/2004 |
| TW | M274831 | 9/2005 |

OTHER PUBLICATIONS

Office Action dated Jul. 12, 2010, issued for the Taiwanese Patent Application.

Office Action dated Jul. 12, 2010, issued for the Taiwanese Patent Application and English translation thereof.

International Search Report mailed Jan. 15, 2008, issued on PCT/JP2007/069839.

Notification of Reasons for Refusal dated Oct. 19, 2010, issued for the Japanese Patent Application No. 2006-280660 and English abstract thereof.

European Search Report for European Patent Application No. 07829577.1 issued Sep. 7, 2011.

* cited by examiner

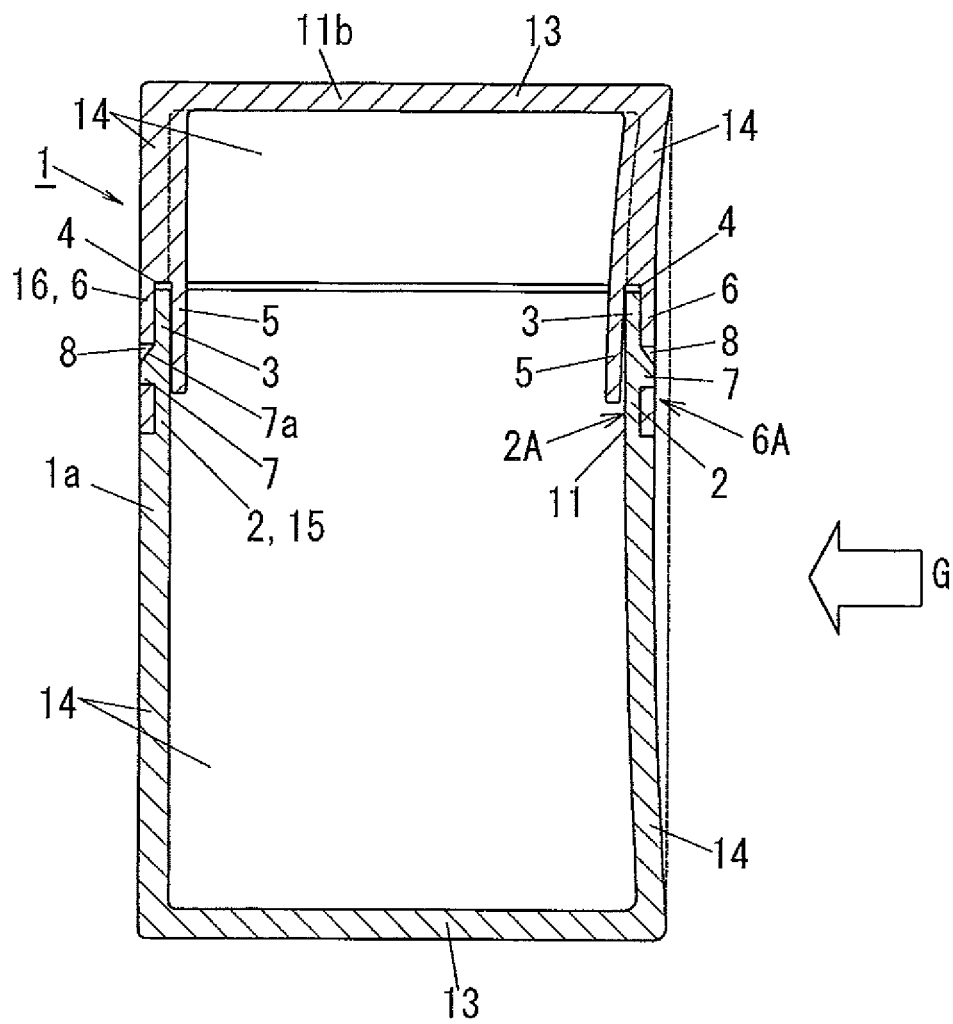
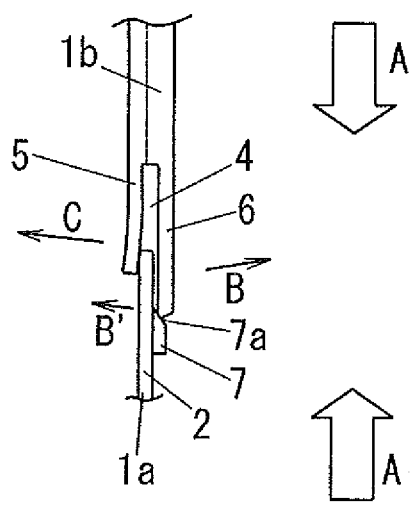
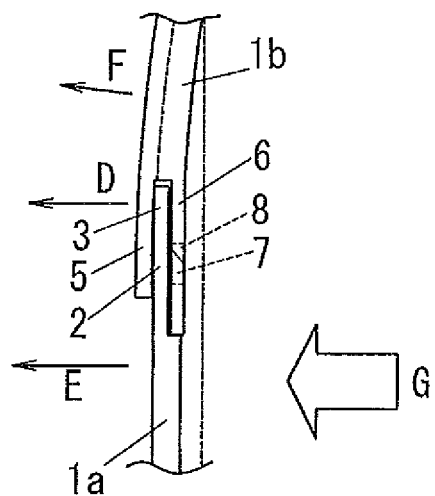

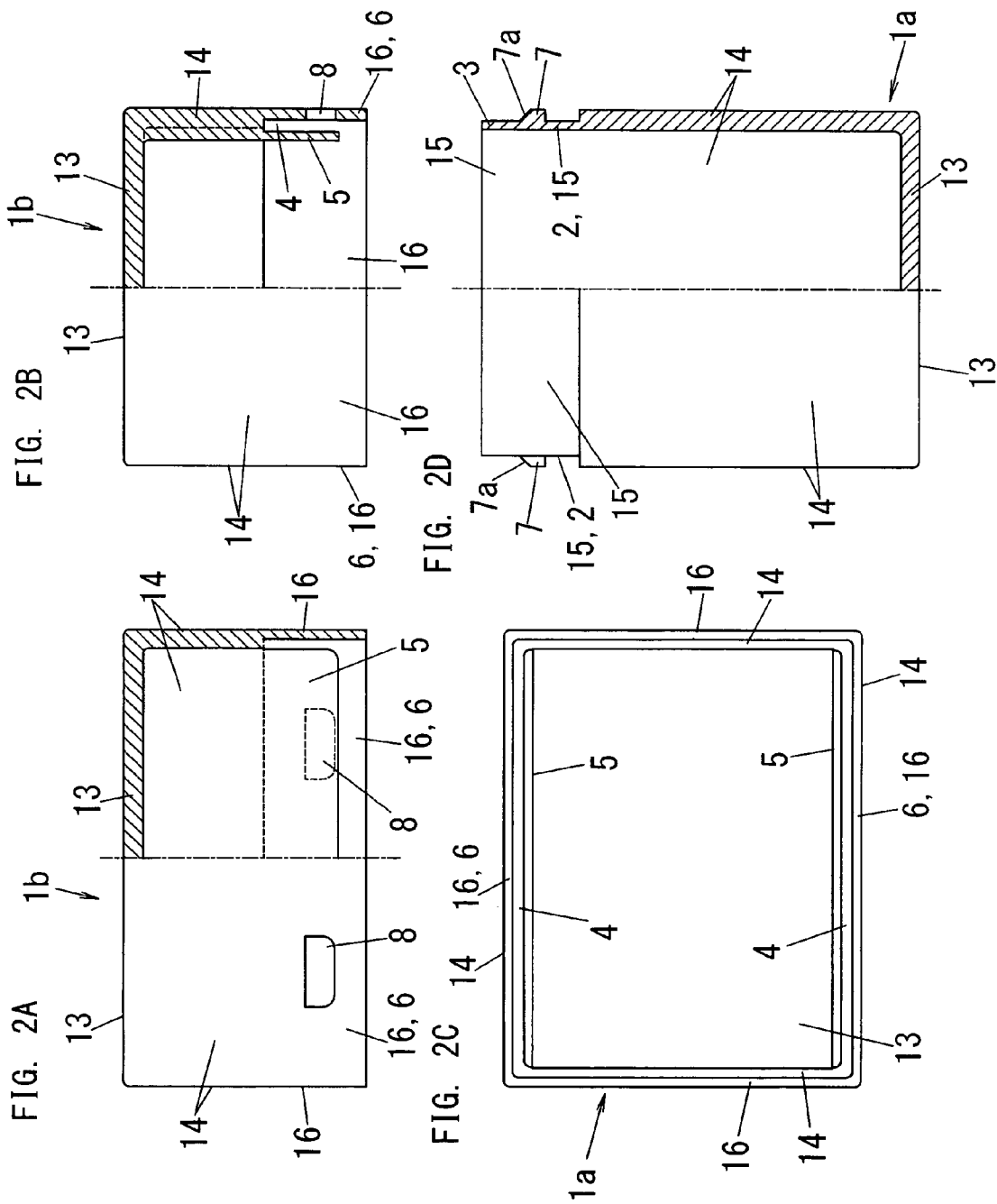

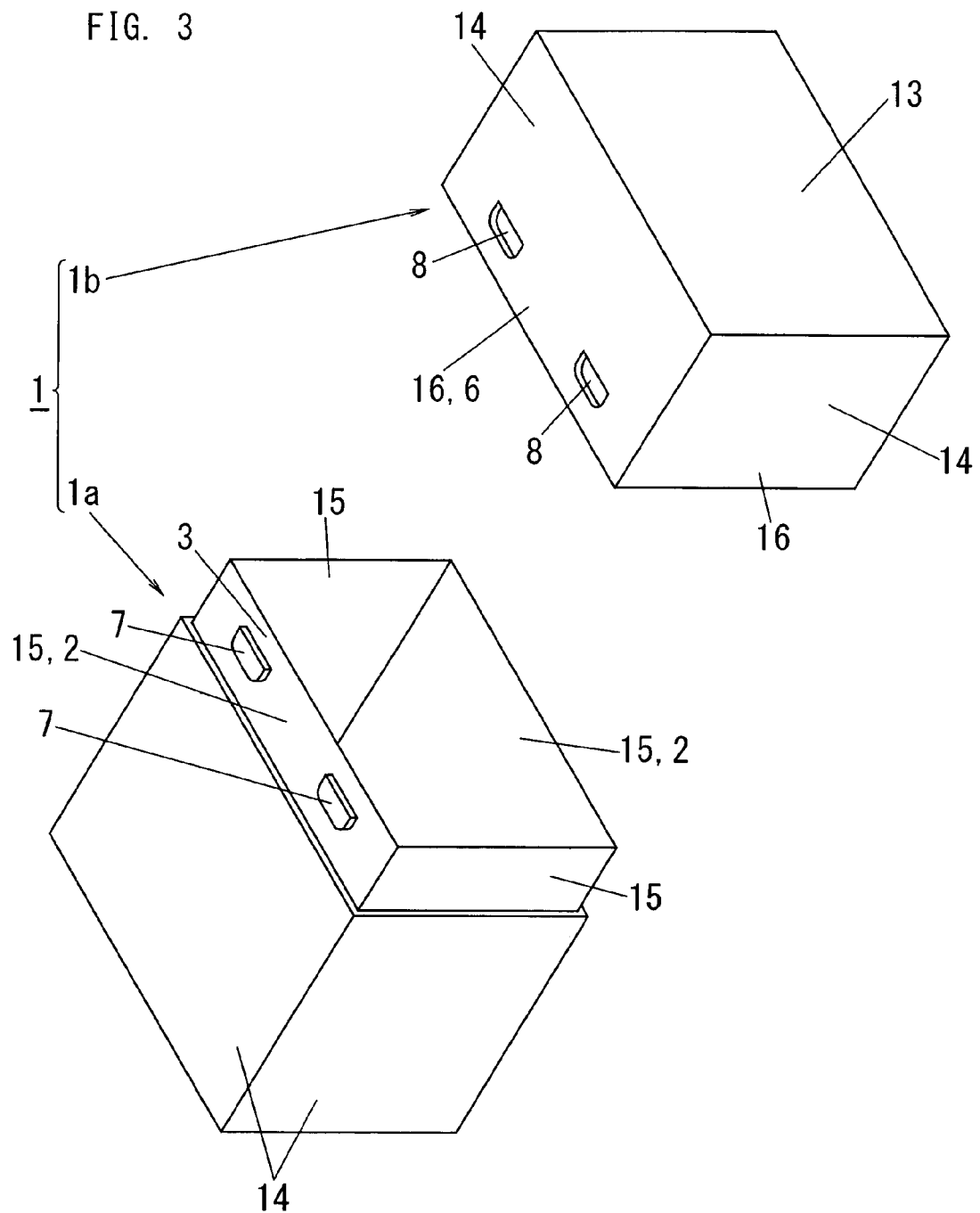

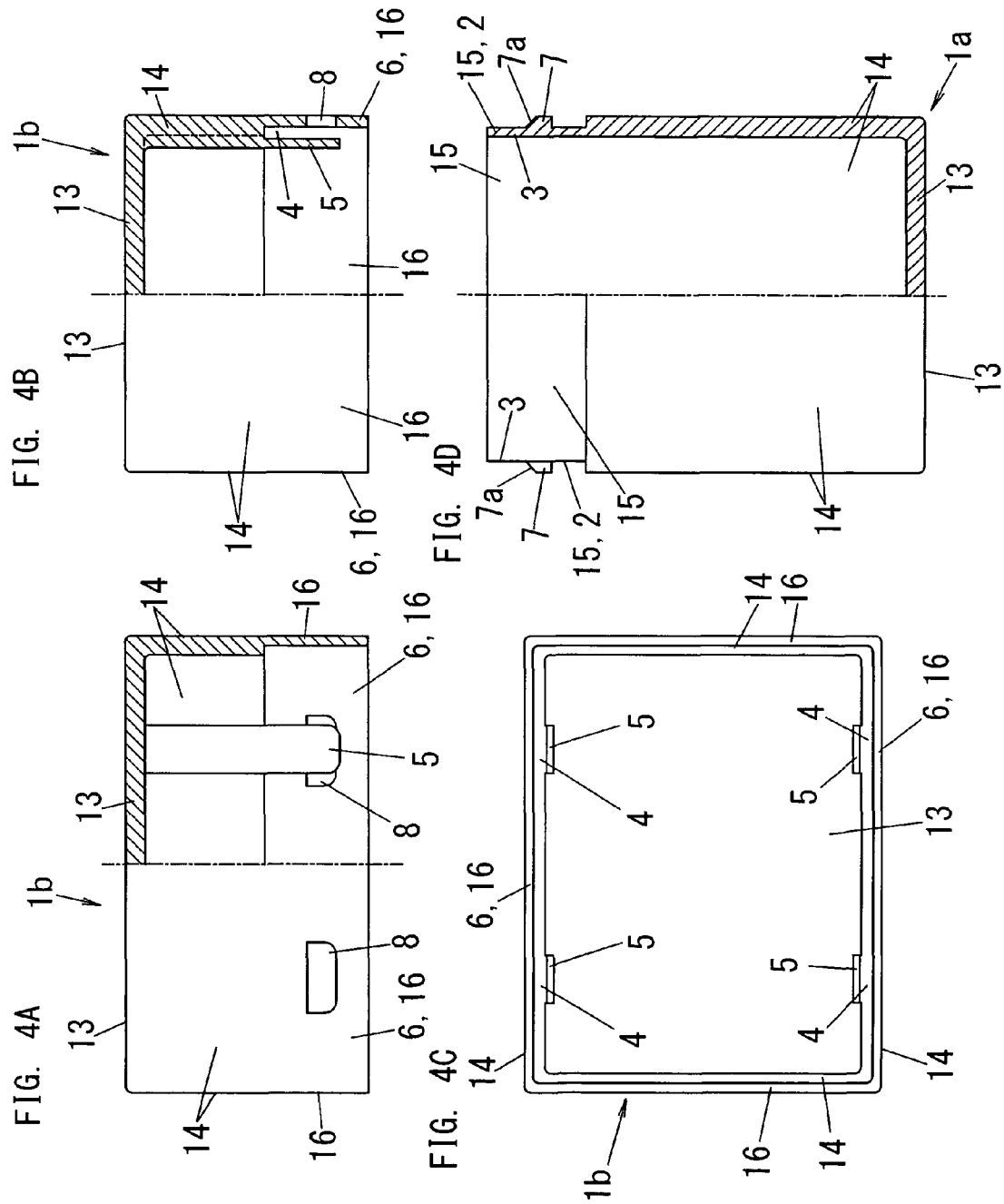

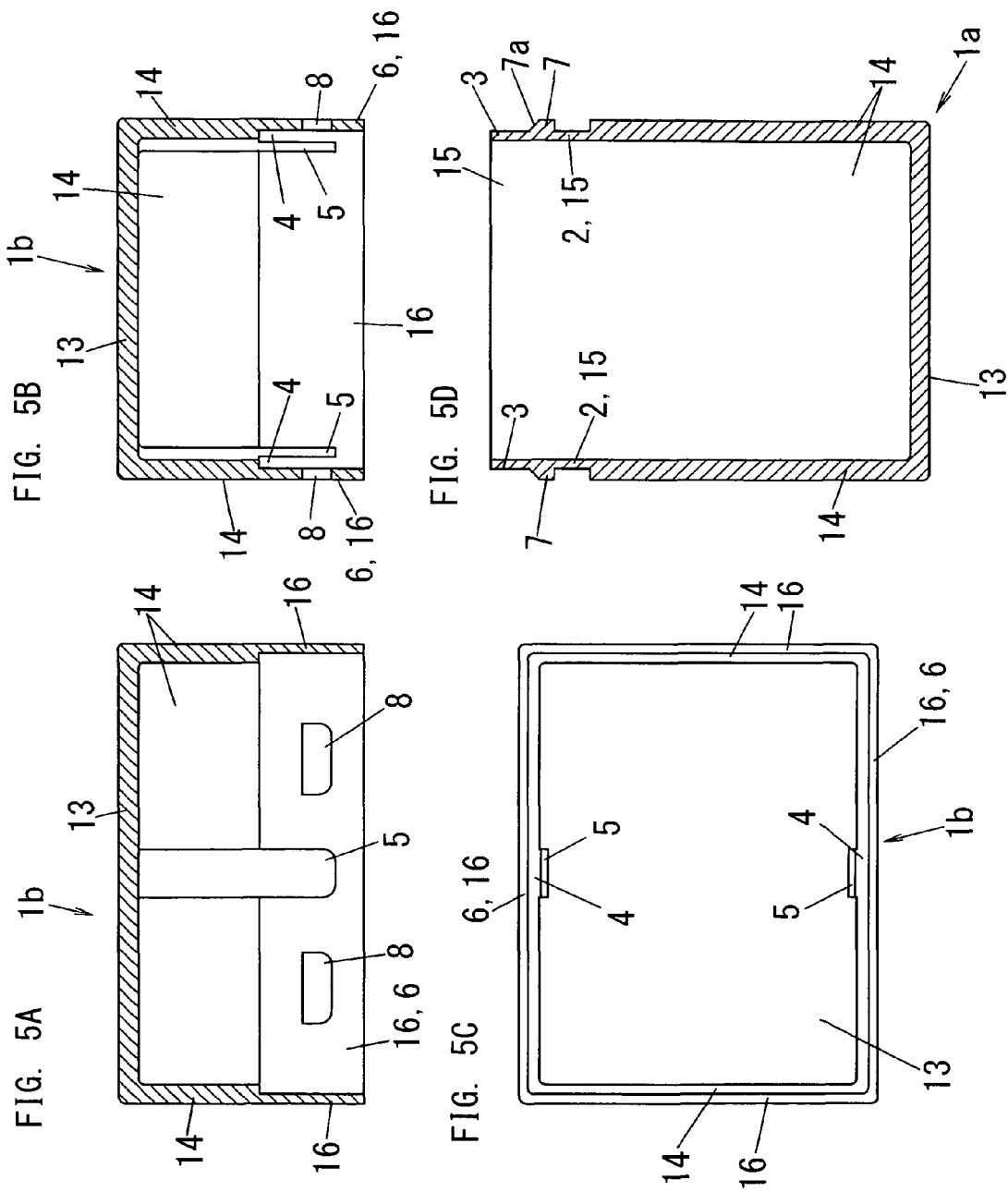

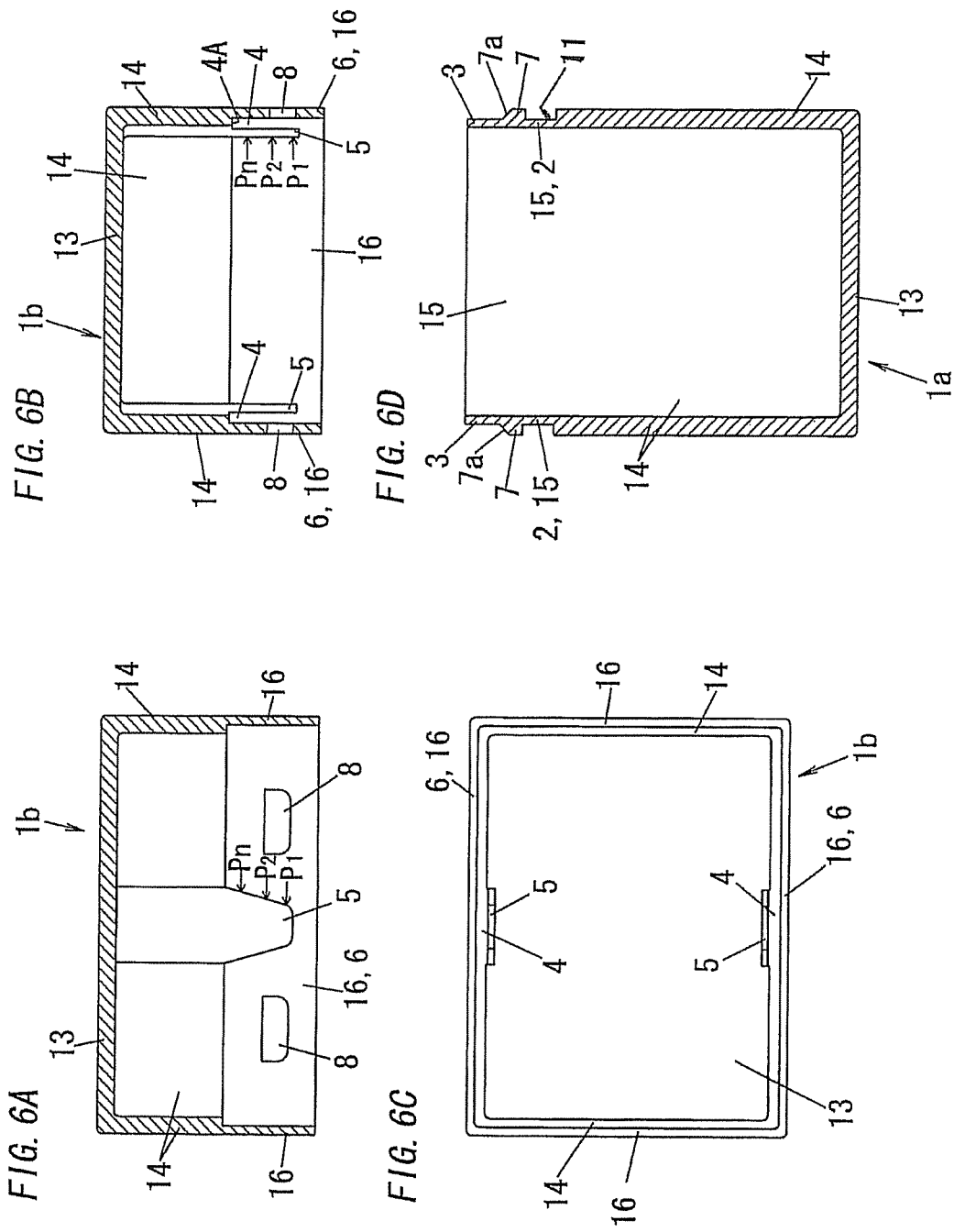

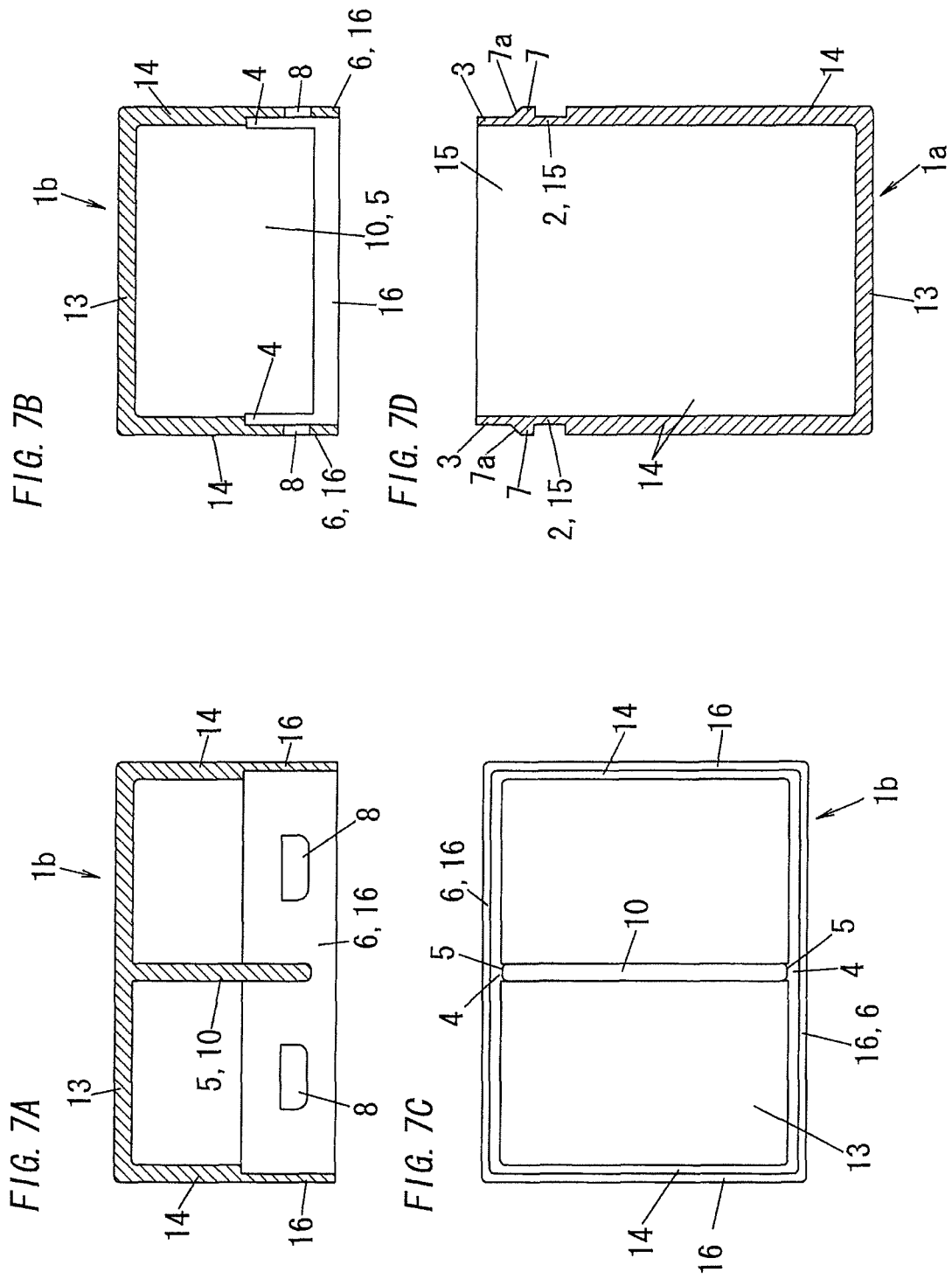

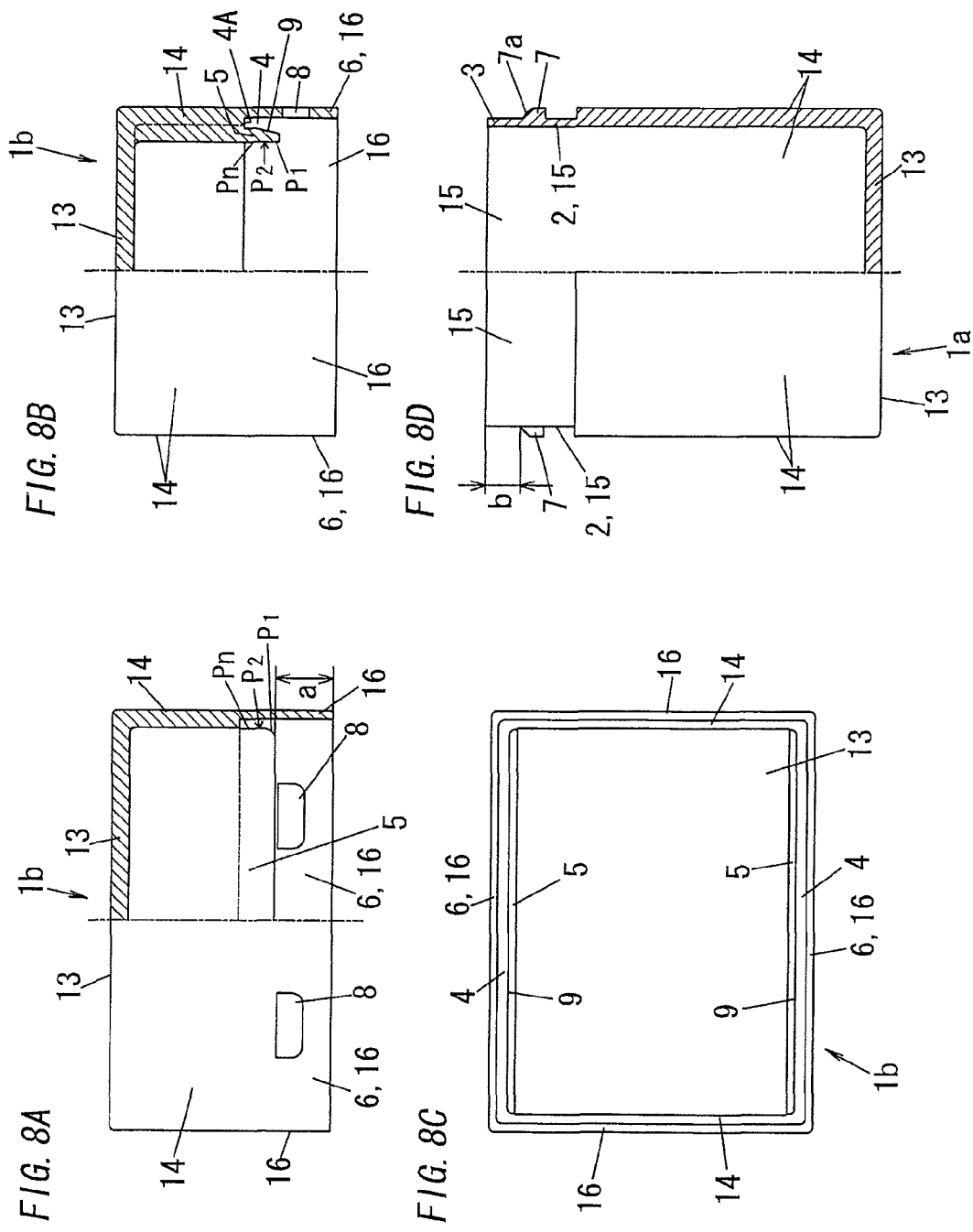

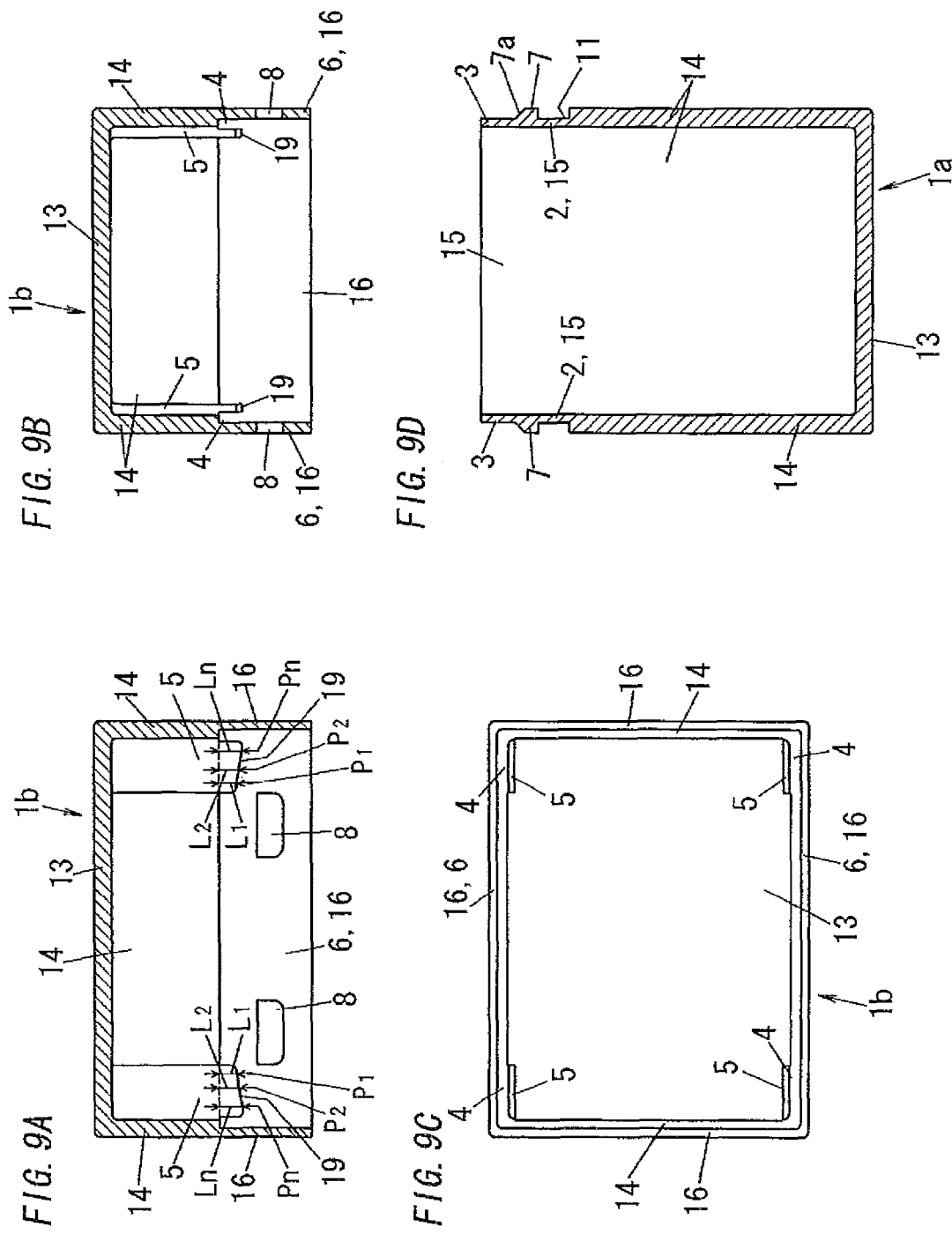

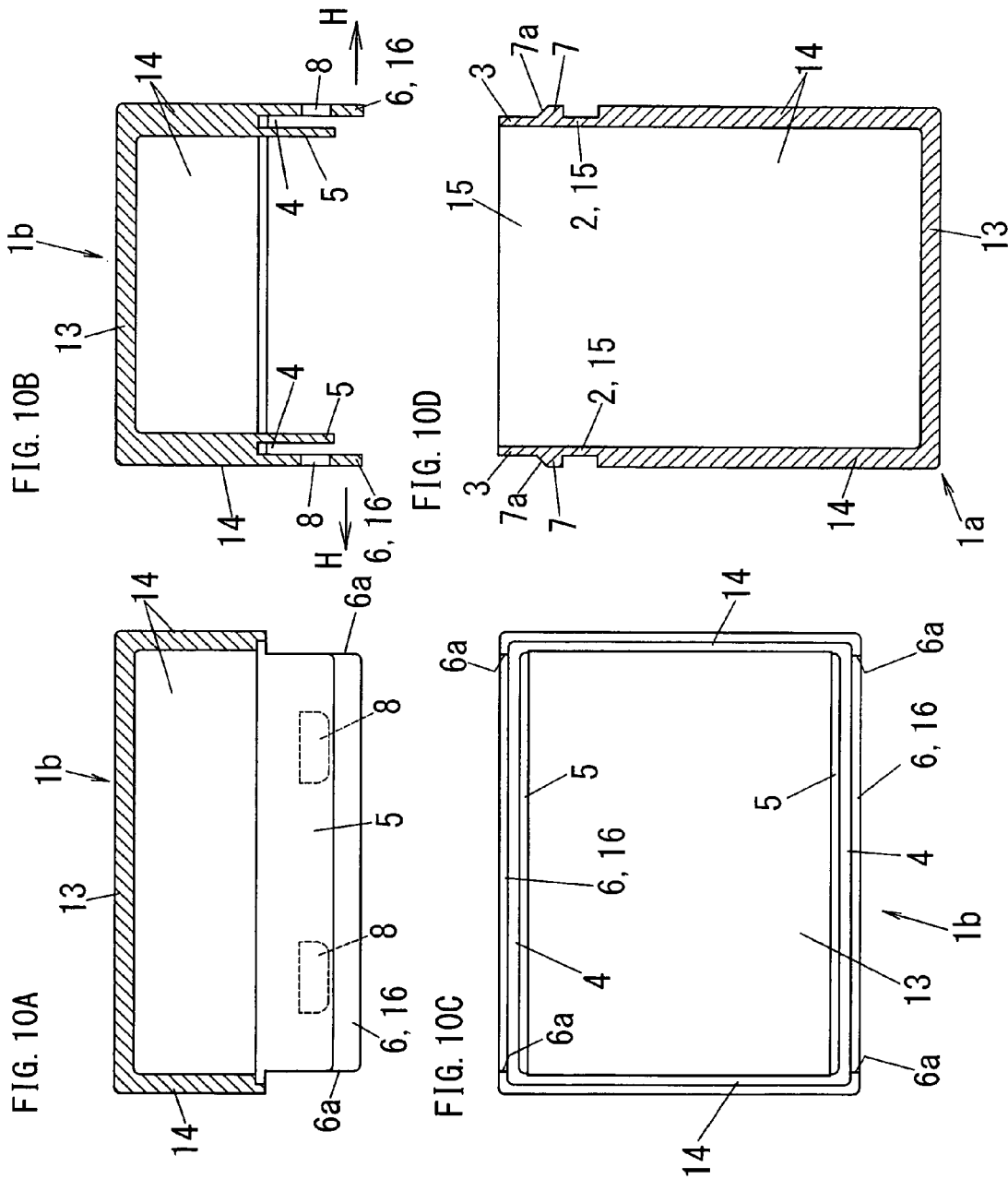

FIT STRUCTURE OF A HOUSING

CROSS-REFERENCE TO RELATED APPLICATION

This application is the U.S. national phase, pursuant to 35 U.S.C. §371, of international application No. PCT/JP2007/069839 published in Japanese on Apr. 17, 2008 as international publication No. WO 2008/044730 A1, which claims the benefit of Japanese Patent Application Ser. No. 2006-280660, filed Oct. 13, 2006, the disclosure of which applications are incorporated herein in their entireties by this reference.

TECHNICAL FIELD

The invention relates generally to fit structure of a housing and, more particularly, to fit structure of a housing formed of two halves.

BACKGROUND ART

As shown in FIG. 14, it is conventionally known that a hollow housing (container) (PA1) is formed by joining first and second halves (PA1*a* and PA1*b*) together so as to form a single one (e.g., Japanese Patent Application Publication Number H10-23563 issued Jan. 23, 1998). In this figure, fit projection parts (PA2) stuck out of the first half (PA1*a*) are fit in fit grooves (PA4) made in the second half (PA1*b*), respectively. Specifically, nails (PA7) are respectively stuck out in the outward directions of the long sides of the first half (1*a*) from the tips of the fit projection parts (PA2). The nails (PA7) are engaged with nail holders (recesses) (PA8) provided for the fit grooves (PA4), respectively, when the fit projection parts (PA2) are fit in the fit grooves (PA4).

Thus, the nails (PA7) and the nail holders (PA8) engaged with each other are used for the fit structure of the housing (PA1). In addition, in order to easily insert the fit projection parts (PA2) into the fit grooves (PA4), each fit groove (PA4) is formed into such a shallow groove as the only tip of a corresponding fit projection part (PA2) is fit in itself. However, when the housing (PA1) receives impact, any of the fit projection parts (PA2) may come off from a corresponding fit groove(s) (PA4) by bounce of the impact. In this case, the housing (PA1) can be easily broken down into the first and second halves (PA1*a* and PA1*b*). Specifically, a load may be added to the first half (PA1*a*) in the inward and outward direction of the housing (PA1), i.e., in the opposite direction of the insertion direction of the nails (PA7) into the nail holders (PA8) in one side as shown in the arrow "G". In this instance, deformation and bending of each tip of the fit projection parts in the one side becomes larger than that of each tip of the fit projection parts in the opposite side. Accordingly, since the nails (PA8) of the fit projection parts (PA2) in the one side can easily come off from the corresponding nail holders (PA8), fit structure of the fit projection parts and the fit grooves in the housing can easily come off.

Further expanding on the above, the internal walls of some fit grooves (PA4) are end faces of elastic pieces (free ends) (PA20) which can elastically deform in the directions of the arrows "$J_1$" and "$J_2$". When the corresponding fit projection parts (PA2) are inserted into the fit grooves (PA4), the elastic pieces (PA20) are pushed by the fit projection parts (PA2) to elastically deform, and accordingly the widths of the fit grooves are be spread. Thereby, the fit projection parts can be easily engaged with the fit grooves. However, in case a load is added to the first half (PA1*a*) as stated above, the elastic pieces (PA20) are pushed by the tips of the corresponding fit projection parts (PA2) largely deformed and then bent by the load, and accordingly elastically deform. As a result, the widths of the corresponding fit grooves (PA4) are spread. Therefore, fit structure of the fit projection parts and fit grooves in the housing can easily come off.

DISCLOSURE OF THE INVENTION

It is an object of the present invention to enable two halves constituting a housing to easily fit and also to strongly maintain fit condition of the two halves even if a load such as impact or the like is added to the housing.

The present invention concerns fit structure of a housing formed of two halves. A first half of the halves comprises a fit projection piece formed to stick out towards a second half of the halves. The fit projection piece has a fit tongue at the tip. The second half comprises a presser part and an engaging piece between which a fit groove towards the first half is formed. The fit projection piece, the presser part and the engaging piece are formed so that the fit tongue of the fit projection piece is positioned in the inner part of the fit groove along the root of the presser part when the fit projection piece is fit in the fit groove. The housing further comprises a nail and a nail holder. The nail is stuck out in an inward or outward direction with respect to the housing. The nail holder is engaged with the nail. The nail and nail holder are located at one and the other of a part of the fit projection piece and a corresponding part of the engaging piece. The part of the fit projection piece is nearer to the root of the fit projection piece than the fit tongue.

In this structure, since the nail and the nail holder are located at one or the other of the part of the fit projection piece nearer to the root of the fit projection piece than the fit tongue and the corresponding part of the engaging piece, the nail and the nail holder can be engaged with each other at a shallow part from the opening of the fit groove.

Accordingly, ease of fit of the fit projection piece into the fit groove can be secured in comparison with the conventional structure where the nails (PA7) are formed at the tips of the fit projection parts (PA2), respectively. When the fit projection piece is inserted into the fit groove, the fit tongue is inserted into the fit groove before the nail is engaged with the nail holder. Accordingly, the fit tongue has a function of introduction guide for preventing the fit projection piece from coming off from the fit groove when the nail is inserted into the fit groove. Thereby, ease of fit of the fit projection piece into the fit groove can be heightened. Thus, since ease of fit of the fit projection piece into the fit groove can be secured, it is possible to get out of the conventional shallow groove structure in which the tip formed with the nail (PA7) in the fit projection part (PA2) is only fit in the fit groove (PA4). And the fit groove becomes a deep groove, and accordingly fit strength of the fit projection piece into the fit groove can be improved. That is, in the fit condition of the fit projection piece into the fit groove, even if stress on the fit tongue becomes large in response to the load added in an inward and outward direction with respect to the housing and then the fit tongue presses the presser part, the fit tongue is positioned in the inner part of the fit groove along the root of the presser part, and accordingly fit of the fit projection piece into the fit groove is hardly collapsed. In short, the pressure load is supported by the whole housing, and therefore fit condition of the fit projection piece into the fit groove can be firmly maintained, and the fit projection piece can be effectively prevented from coming off from the fit groove.

In an embodiment, the presser part is a rectangular presser piece, and the width of the presser piece is substantially the same as that of the engaging parts of the nail and the nail holder. This invention can downsize the presser piece and reduce the cost of materials, while securing not only engaging strength of the nail with the nail holder but also firm fit strength of the fit projection piece into the fit groove, In an embodiment, the first half has one of a pair of nails and a pair of nail holders as the nail and the nail holder, and the second half has a rectangular side and the other of the pair of nails and the pair of nail holders. The other of the pair of nails and the pair of nail holders is located at both sides of the rectangular side. In addition, the presser part is located between the other of the pair of nails and the pair of nail holders in the rectangular side. This invention can downsize the presser piece and reduce the cost of materials while securing not only engaging strength of the nails with the nail holders but also balance of firm fit strength of the fit projection pieces into the fit grooves.

In an embodiment, the nearer the position of a cross-sectional area of the presser part is to the bottom of the fit groove, the larger the cross-sectional area becomes. In this structure, the tip side of the presser part can be easy to be elastically deformed, and the root side of the presser part can be hard to be elastically deformed. Accordingly, ease of fit of the fit projection piece into the fit groove can be heightened, and the fit can be more strongly maintained.

In an embodiment, the second half has a rectangular bottom, and the presser part is an edge of an projection piece located between facing edges of the rectangular bottom. In this structure, it is possible to prevent stress deformation of the projection piece in an inward and outward direction with respect to the housing, and accordingly fit of the fit projection piece into the fit groove can be more strongly maintained.

In an embodiment, the presser part is a rectangular presser piece of which surface facing the engaging piece forms a guide surface. In addition, the nearer a position in the guide surface is to the tip of the presser piece, the larger an opening width of the fit groove between the guide surface and the engaging piece becomes. In this structure, the fit projection piece can be easily inserted into the fit groove, and ease of fit of the fit projection piece into the fit groove can be heightened.

In an embodiment, the second half has a rectangular side, and the presser part is a rectangular presser piece located at an end of the rectangular side. The nearer a position on the tip of the presser piece is to the edge of the end of the rectangular side, the longer the projection length of the tip of the presser piece becomes. In this structure, if a position on the tip of the presser piece is near to the edge of the end of the rectangular side, a part of the position in the tip is hardly deformed and bent. Therefore, the fit projection piece can be inserted into the fit groove from the side that is hardly deformed and bent. On account of this, insertion stability of the fit projection piece into the fit groove can be heightened, and ease of fit of the fit projection piece into the fit groove can be heightened.

In an embodiment, each of the first and second halves is a box having a rectangular bottom and four rectangular sides. The second half has a pair of rectangular presser pieces as the presser part. The pair of rectangular presser pieces is formed at the tips of facing sides of the second half, and both ends of each of the presser pieces are free ends. In this structure, the only engaging piece can be deformed and bent in the inward and outward direction of the housing without deforming the whole housing. Therefore, in the state that the fit projection piece is fit in the fit groove (i.e., the housing is formed), if the only engaging piece is deformed and bent in the inward and outward direction with respect to the housing while fingering the engaging piece or the like, engaging of the nail with the nail holder can be released. In short, the housing can be easily broken down into the first and second halves.

BRIEF DESCRIPTION OF THE DRAWINGS

Preferred embodiments of the invention will now be described in further details. Other features and advantages of the present invention will become better understood with regard to the following detailed description and accompanying drawings where:

FIGS. 1A-1C illustrate an embodiment of the present invention, and are a sectional view of a housing, a sectional view of essential parts when a fit projection piece is inserted into a fit groove, and a sectional view of essential parts when a load is added to the housing in the inward direction in the fit condition of the fit projection piece in the fit groove, respectively;

FIGS. 2A-2D are a partial exploded view of a second half, a partial exploded view as seen from right of FIG. 2A, a bottom view of FIG. 2A, and a partial exploded view of a first half, respectively;

FIG. 3 is an exploded perspective view of the housing;

FIGS. 4A-4D illustrate an embodiment, and are a partial exploded view of a second half, a partial exploded view as seen from right of FIG. 4A, a bottom view of FIG. 4A, and a partial exploded view of a first half, respectively;

FIGS. 5A-5D illustrate an embodiment, and are a partial exploded view of a second half, a partial exploded view as seen from right of FIG. 5A, a bottom view of FIG. 5A, and a partial exploded view of a first half, respectively;

FIGS. 6A-6D illustrate an embodiment, and are a partial exploded view of a second half, a partial exploded view as seen from right of FIG. 6A, a bottom view of FIG. 6A, and a partial exploded view of a first half, respectively;

FIGS. 7A-7D illustrate an embodiment, and are a partial exploded view of a second half, a partial exploded view as seen from right of FIG. 7A, a bottom view of FIG. 7A, and a partial exploded view of a first half, respectively;

FIGS. 8A-8D illustrate an embodiment, and are a partial exploded view of a second half, a partial exploded view as seen from right of FIG. 8A, a bottom view of FIG. 8A, and a partial exploded view of a first half, respectively;

FIGS. 9A-9D illustrate an embodiment, and are a partial exploded view of a second half, a partial exploded view as seen from right of FIG. 9A, a bottom view of FIG. 9A, and a partial exploded view of a first half, respectively;

FIGS. 10A-10D illustrate an embodiment, and are a partial exploded view of a second half, a partial exploded view as seen from right of FIG. 10A, a bottom view of FIG. 10A, and a partial exploded view of a first half, respectively;

BEST MODE FOR CARRYING OUT THE INVENTION

Figure 11A:
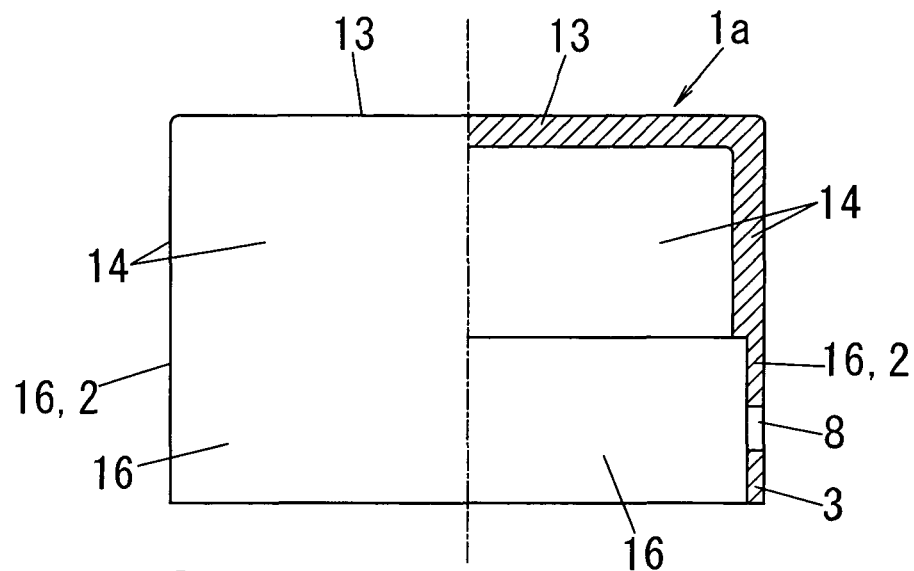
FIGS. 11A and 11B illustrate an embodiment, and are a partial exploded view of a second half, and a partial exploded view of a first half, respectively.

FIGS. 1A-1C, 2A-2D and 3 show an embodiment of the present invention. As shown in FIGS. 2A-2D, a housing (1) is a hollow rectangular case with a lid, and electric parts and so on can be put in the housing (1). The housing is formed of first and second halves (1a and 1b) each of which is a box having a rectangular bottom (13) and four rectangular sides (14). That is, the housing is formed by joining the first and second halves (1a and 1b) together so as to form a single one. For example, the first half (1a) of which height is higher than the second half (1b) is a body case, and the second half (1b) is a lid case. As a matter of convenience, each direction is defined based on the state that the housing (1) is formed by attaching the second half (1b) on the first half (1a). For example, the facing direction of the first and second halves is an up-and-down direction, and a circumferential direction of the housing (1) is a direction around the up-and-down direction, along each four sides of the first and second halves.

As shown in FIG. 2D, the upper parts of the four sides (14) in the first half (1a) is formed with continuous four thin pieces (15) so that inner half in the thickness direction of each of the upper parts is remained over the circumferential direction of the housing (1). The thin pieces (15) of the facing long sides (14) are employed as fit projection pieces (2). That is, in the embodiment, two fit projection pieces (2) are formed over the long sides of the first half (1a). The upper end of each fit projection piece (2) is a fit tongue (3) which is fit in the bottom (the inner part) of a corresponding fit groove (4). The fit grooves (4) are discussed later. In each fit projection piece (2), a part (2A) of the projection piece (2) nearer to the root (11) of the projection piece (2) than the fit tongue (3) is formed with nails (7) sticking out in the outward direction of the housing (1). Specifically, each nail (7) is formed at an intermediate part in the projection direction of a corresponding fit projection piece (2). The upper side of each nail (7) is a slope as an insertion guide surface (7a). In each insertion guide surface (7a), the nearer a position on the guide surface (7a) is to the fit tongue (3), the lower the height of the position from the fit projection piece (2) becomes. In each fit projection piece (2) of the embodiment, a pair of nails (7) is symmetrically formed at both sides of the middle part in the width direction of the projection piece (2).

As shown in FIGS. 2A-2C, the lower parts of the four sides (14) in the second half (1b) is formed with continuous four thin pieces (16) so that outer half in the thickness direction of each of the lower parts is remained over the circumferential direction of the housing (1). Projection dimensions of the thin pieces (16) are substantially the same as those of the thin pieces (15) in the first half (1a). The thin pieces (16) of facing long sides (14) in the second half (1b) are employed as engaging pieces (6). A pair of presser pieces (5) is also formed inside the facing engaging pieces (6) so as to face the engaging pieces (6) through a pair of fit grooves (4), respectively. Each presser piece (5) is formed over the width direction of a corresponding long side (14). Therefore, each fit groove (4) is formed of a pair of presser piece (5) and engaging piece (6), as well as a part of the side (14) forming the bottom of the fit groove (4). Each engaging piece (6) is formed with a through hole as a nail holder (8) with which a corresponding nail (7) is engaged when the fit projection pieces (2) are respectively fit in the fit grooves (4). Each nail holder (8) is formed at an intermediate part in the projection direction of a corresponding engaging piece (6). Each presser piece (5) is also extended up to the lower end of each nail holder (8). In each engaging piece (6) of the embodiment, a pair of nail holders (8) is symmetrically formed at both sides of the middle part in the width direction of the engaging piece (6).

Integration of the first half (1a) and the second half (1b) for the formation of the housing (1) is performed by fitting the fit projection pieces (2) in the fit grooves (4), respectively as shown in FIG. 1A. That is, the first and second halves (1a and 1b) are approached as shown in arrows "A" of FIG. 1B, and then the fit projection pieces (2) are respectively fit in the fit grooves (4). At this point, each fit tongue (3) is inserted into each fit groove (4) before each nail (7) is engaged with each nail holder (8). Accordingly, the fit tongues (3) have introduction guide functions for preventing the fit projection pieces (2) from coming off from the fit grooves (4) when the nails (7) are inserted into the fit grooves (4). When the nails (7) are inserted into the fit grooves (4), the engaging pieces (6) are gradually pushed outward by the insertion guide surfaces (7a) of the nails (7), and then deformed and bent (arrow "B" of FIG. 1B). When the fit projection pieces (2) are further inserted into the fit grooves (4) from the state, the fit tongues (3) are positioned at the inner parts of the fit grooves (4) while the nails (7) are engaged with the nail holders (8), as shown in FIGS. 1A and 1C. Thereby, the first and second halves (1a and 1b) are in the state that the fit projection pieces (2) are fit in the fit grooves (4).

As stated above, the nails (7), and the nail holders (8) are located at the parts (2A) of the fit projection pieces (2) nearer to the roots of the fit projection pieces (2) than the fit tongues (3), and the corresponding parts (6A) of the engaging pieces (6), respectively. Accordingly, the nails (7) and the nail holders (8) can be engaged wit each other at shallow parts from the openings of the fit grooves (4). Consequently, ease of fit of each fit projection piece (2) into each fit groove (4) can be secured in comparison with the conventional structure where the nails (PA7) are formed at the tips of the fit projection parts (PA2), respectively. Also, in the embodiment, the presser pieces (5) and the engaging pieces (6) can be deformed and bent in inward and outward direction with respect to the housing (1), and projection dimensions of the presser pieces (5) are shorter than those of the engaging pieces (6). Accordingly, as shown in FIG. 1B, when the insertion guide surfaces (7a) of the nails (7) press the lower ends (projection tips) of the engaging pieces (6) outward (arrow "B"), the fit projection pieces (2) can press the lower ends (projection tips) of the presser pieces (5) inside the housing (1) by the reaction force (arrow "B'") as shown in the arrow "C" of FIG. 1B. Each lower end (projection tip) of the presser pieces (5) and the engaging pieces (6) is a free end, and accordingly can be easily bent in the inward and outward direction of the housing (1) in comparison with each root side. That is, the opening widths of the fit grooves (4) (distance between each presser piece (5) and each engaging piece (6)) can be easily spread. Thereby, ease of fit of each fit projection piece (2) into each fit groove (4) can be improved.

In the fit condition of the fit projection pieces (2) into the fit grooves (4), each fit tongue (3) is in the state that it is positioned in the inner part of each fit groove (4) along the root of each presser piece (5) as shown in FIGS. 1A and 1C. As shown in the arrow "G" of FIG. 1C, when the housing (1) is dropped or the like, a load can be added to the housing (1) in the inward and outward direction (ejection direction of a nail (7) from a nail holder (8) (inward direction of the housing (1) in the embodiment)). When such load is added to the housing (1), force of deforming and bending some fit tongues (3) becomes large, and the fit tongue (3) presses the corresponding presser piece (5) as shown in the arrow "D". However, since the fit tongue (3) presses the root part of the presser piece (5), the presser piece (5) is not easily deformed, and the whole housing (1) can support the press load on the presser piece (5). In short, fit condition of each fit projection piece (2) into each fit groove (4) can be firmly maintained, and the housing (1) can be effectively prevented from being broken down into the first and second halves (1a and 1b). For example, even if a large load added to the first half (1*a*) tries to deform and bend the whole side of the first half (1*a*) inside the housing (1) as shown in the arrow "E", the fit tongue (3) having the large deformation and bending force only presses the root part of the presser piece (5) as shown in the arrow "D". Accordingly, the second half (1*b*) is then deformed as shown in the arrow "F", but deformation and bending of the whole housing (1) are restrained, and deformation and bending of the fit projection piece (2) are also restrained small. That is, deformation and bending at the nails (7) located at the intermediate part in the projection direction of the fit projection piece (2) are small, and accordingly the nails (7) hardly come off from the nail holders (8). Accordingly, fit condition of each fit projection piece (2) into each fit groove (4) can be firmly maintained.

In an embodiment, as shown in FIGS. 4A-4D, the width of the presser piece (5) is substantially the same as that of the engaging parts of the nail (7) and the nail holder (8). In the figures, a pair of presser pieces (5) is located in each engaging piece (6). Thus, since a pair of presser pieces (5) is partially located in the width direction of each engaging piece (6), materials can be saved in comparison with said embodiment (hereinafter referred to as a "first embodiment") where a pair of presser pieces (5) is located over the widths of a pair of engaging pieces (6), respectively. Since each of the presser pieces (5) pressing the fit projection pieces (2) inserted into the fit grooves (4) is substantially the same as the width of engaging parts of the nail (7) and the nail holder (8), it is possible to heighten engaging strength of each nail (7) with each nail holder (8) when the fit projection pieces (2) are fit in the fit grooves (4). Accordingly, in the embodiment, it is possible to downsize the presser pieces and to reduce the cost of materials while securing firm fit strength of the fit projection pieces (2) into the fit grooves (4).

In an embodiment, as shown in FIGS. 5A-5D, a pair of engaging pieces (6) is respectively provided with a pair of presser pieces (5) each of which is located between a corresponding pair of nail holders (8). That is, the pair of presser pieces (5) is only located at the middle parts in the width direction of the pair of engaging pieces (6), respectively. In each engaging piece (6), a pair of nail holders (8) is symmetrically located at both sides of an engaging piece (6) like the first embodiment, and therefore is symmetrically located with respect to the middle part in the width direction of the engaging piece (6), namely the presser piece (5). Accordingly, the presser pieces (5) can press (hold) the fit projection pieces (2) having the nails (7) engaged with the nail holders (8) in good balance. Consequently, in the embodiment, it is possible to downsize the presser pieces (5) and to reduce the cost of materials while securing balance of firm fit strength of the fit projection pieces (2) into the fit grooves (4). Though the middle parts in the width direction of the fit projection pieces (2) are the parts that are most easily bent, each presser piece (5) is located at the middle part in the width direction of each engaging piece (6), and accordingly the parts that are most easily bent are pressed (held) by the presser pieces (5). Therefore, fit condition of the fit projection pieces (2) into the fit grooves (4) can be firmly maintained.

In an embodiment, as shown in FIGS. 6A-6D and 8A-8D, the nearer the position of a cross-sectional area of each presser piece (5) is to the bottom of each fit groove (4), the larger the cross-sectional area becomes. For example, in FIGS. 6A-6D, the nearer the position of a width of each presser piece (5) is to the bottom of each fit groove (4), the larger the dimension of the width becomes. That is, when a cross-sectional area of a presser piece (5) cut in the width direction at the root side is compared with a cross-sectional area of the presser piece (5) cut in the width direction at the tip side, the cross-sectional area at the root side is larger than that at the tip side. In FIGS. 8A-8D, the nearer the position of a thickness of each presser piece (5) is to the bottom of each fit groove (4), the larger the dimension of the thickness (dimension of the presser piece (5) in the inward and outward direction of the housing (1)) becomes. That is, when a cross-sectional area of a presser piece (5) cut in the thickness direction at the root side is compared with a cross-sectional area of the presser piece (5) cut in the thickness direction at the tip side, the cross-sectional area at the root side is larger than that at the tip side. Accordingly, since the tip side of each presser piece (5) can be easy to be elastically deformed and the root side of each presser piece (5) can be hard to be elastically deformed, ease of fit of the fit projection pieces (2) into the fit grooves (4) can be heightened and the fit can be more strongly maintained.

In an embodiment, as shown in FIGS. 7A-7D, the housing (1) is equipped with an projection piece (10) having a pair of presser parts (5) instead of a pair of presser pieces (5). The projection piece (10) is located on the rectangular bottom (13) of the second half (1*b*) from one engaging piece (6) to the other engaging piece (6), and both edges of the projection piece (10) are employed as the pair of presser parts (5). That is, the projection piece (10) is coupled between the long sides (14) of the engaging pieces (6). On account of this, rigidity of the second half (1*b*) is also improved. Since the projection piece (10) is hardly deformed and bent in the inward and outward direction of each engaging piece (6) of the housing (1), deformation and bending of the presser parts (5) can be preferably prevented and fit of the fit projection pieces (2) into the fit grooves (4) can be more strongly maintained. However, not limited to this, the thickness dimension of the projection piece (10) may be increased and also a plurality of projection pieces (10) may be located side by side. In this case, deformation and bending of the presser parts (5) can be more preferably prevented and fit of the fit projection pieces (2) into the fit grooves (4) can be further more strongly maintained. In addition, in order to increase the internal space of the housing (1), the middle part in the length direction of the projection piece (10) may be suitably removed.

In an embodiment, as shown in FIGS. 8A-8D, the surface facing the engaging piece (6) in each presser piece (5) is formed with a guide surface (9). The nearer a position in the guide surface (9) of each presser piece (5) is to the tip of the presser piece (5), the larger an opening width of the fit groove (4) between the guide surface (9) and the engaging piece (6) becomes. In this case, the fit projection pieces (2) can be easily inserted into the fit grooves (4) and ease of fit of fit projection pieces (2) into the fit grooves (4) can be heightened. As shown in FIGS. 8A and 8D, the embodiment is effective in case the dimension "b" up to the nails (7) from the tip of each fit projection piece (2) cannot be made larger than the corresponding dimension "a" up to the tips of the engaging pieces (6) from the tips of the presser pieces (5). That is, it is effective in case the fit tongues (3) do not reach the tips of the presser pieces (5) at a point in time at which the nails (7) press the engaging pieces (6) in the inward and outward direction of the housing (1) when the fit projection pieces (2) are inserted into the fit grooves (4). In case of the dimension (a>b) in the embodiment, each presser piece (5) is shorter than each presser piece (5) of the first embodiment, and accordingly the inner space of the housing (1) can be increased.

In an embodiment, as shown in FIGS. 9A-9D, the housing (1) is equipped with rectangular presser pieces (5) located at both ends of each engaging piece (6) instead of the presser pieces (5) of the first embodiment. The nearer a position on the tip (19) of each presser piece (5) is to the edge of an end in the corresponding engaging piece (6), the longer the projection length of the tip (19) of the presser piece (5) becomes. That is, the tip (19) of each presser piece (5) is inclined. An end of each engaging piece (6) is hardly deformed and bent by rigidity of each neighboring side (14) in comparison with the middle part of the engaging piece (6). Because of this, the fit tongues (3) can be inserted into the fit grooves (4) from the sides that are hardly deformed and bent, by the presser pieces (5). Consequently, insertion stability of the fit projection pieces (2) into the fit grooves (4) can be heightened, and fit ease of the fit projection pieces (2) into the fit grooves (4) can be heightened. Since such presser piece (5) is located at each end of the engaging pieces (6) in particular, the foregoing functions and advantages can be displayed effectively.

In an embodiment, as shown in FIGS. 10A-10D, the second half (1b) has a pair of rectangular presser pieces (5). The pair of presser pieces (5) is formed at the tips of facing sides (14) of the second half (1b), and both ends of each presser piece (5) are free ends (6a). That is, the pair of thin pieces (16) except the pair of engaging pieces (6) is removed. In this structure, each engaging piece (6) can be only deformed and bent in the inward and outward direction of the housing (1) without deforming the whole housing (1). Therefore, as shown in each arrow "H" of FIG. 10B, in the state that the fit projection pieces (2) are fit in the fit grooves (4), i.e., the housing (1) is formed, if each engaging piece (6) is only deformed and bent in the inward and outward direction of the housing (1) while fingering each engaging piece (6) or the like, engaging of the nails (7) with the nail holders (8) can be released. In short, the housing (1) can be easily broken down into the first and second halves (1a and 1b).

Figure 11B:
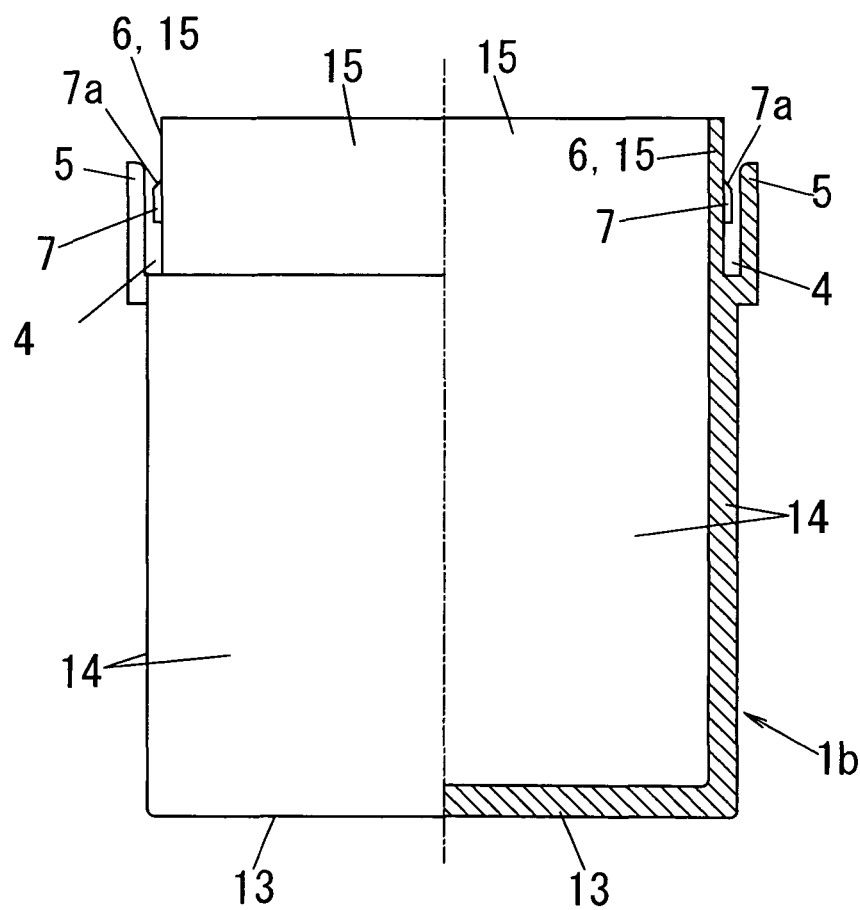

In an embodiment, as shown in FIGS. 11A and 11B, the first half (1a) is a lid case, and the second half (1b) is a body case of which height is higher than the lid case. Therefore, the first half (1a) is provided with a pair of fit projection pieces (2), and the second half (1b) is provided with a pair of fit grooves (4). Each fit groove (4) is formed between a presser piece (5) and an engaging piece (6). Herein, the lower parts of the four sides (14) in the first half (1a) is formed with continuous four thin pieces (16) so that the outer half in the thickness direction of each of the lower parts is remained over the circumferential direction of the housing (1). The thin pieces (16) of the facing long sides (14) are employed as the fit projection pieces (2). On the other hand, the upper parts of the four sides (14) in the second half (1b) is formed with continuous four thin pieces (15) so that the inner half in the thickness direction of each of the upper parts is remained over the circumferential direction of the housing (1). The thin pieces (15) of the facing long sides (14) in the second half (1b) are employed as the engaging pieces (6). Each presser piece (5) is a rise piece formed outside each engaging piece (6). In each fit projection piece (2), a part of the projection piece (2) nearer to the root of the projection piece (2) than the fit tongue (3) is formed with a pair of through holes as nail holders (8). Specifically, each nail holder (8) is formed at an intermediate part in the projection direction of a corresponding fit projection piece (2). Each engaging piece (6) is formed with a pair of nails (7) which are engaged with the corresponding nail holders (8) when the projections piece (2) are fit in the fit grooves (4), respectively. In this structure, functions and advantages like the first embodiment can be also expected. In addition, since each presser piece (5) is located at the exterior of a side (14) of the second half (1b), internal volume of the housing (1) can be increased and the storage capability can be improved.

Figure 12A:
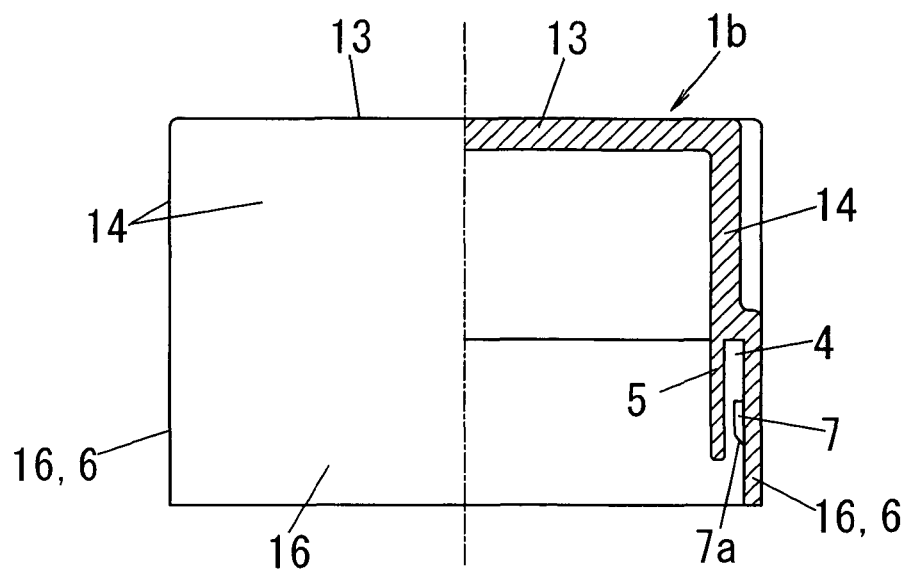
FIGS. 12A and 12B illustrate an embodiment, and are a partial exploded view of a second half, and a partial exploded view of a first half, respectively.
Figure 12B:
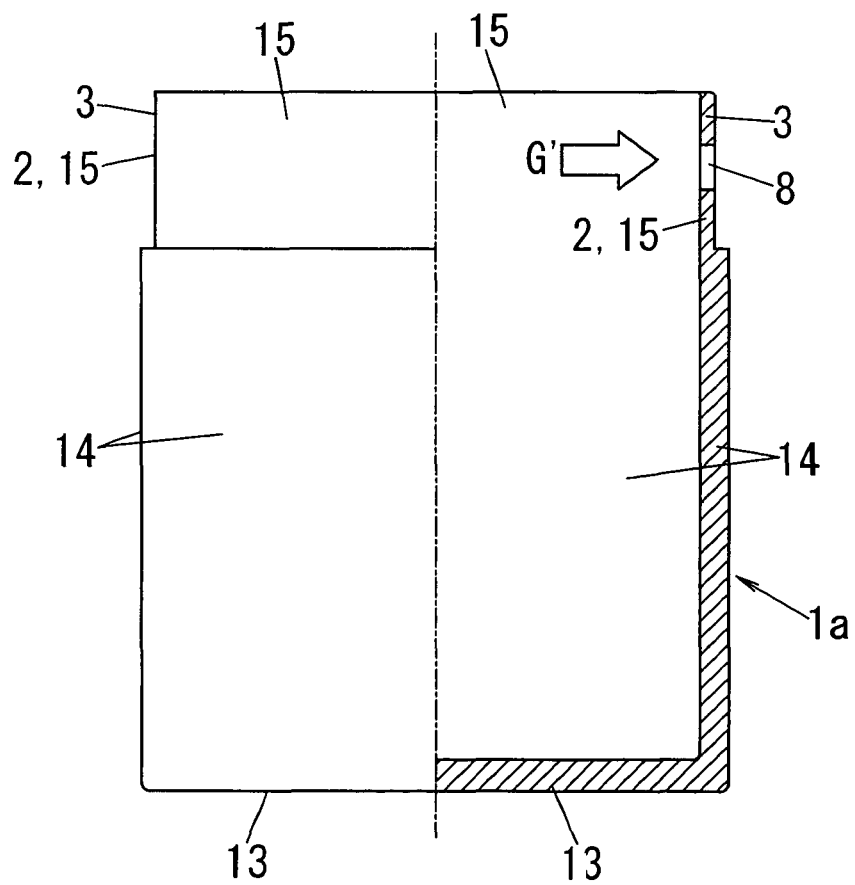

In an embodiment, as shown in FIGS. 12A and 12B, each fit projection piece (2) of the first half (1a) is provided with a pair of nail holders (8), and each engaging piece (6) of the second half (1b) is provided with a pair of nails (7). The pair of nails (7) is formed on the inner face of each engaging piece (6). As shown in the arrow "G" of FIG. 12B, even if a load can be added to the housing (1) in the inward and outward direction (ejection direction of the nails (7) from the nail holders (8) (inward direction of the housing (1) in the embodiment)), fit condition of the fit projection pieces (2) into the fit grooves (4) can be firmly maintained like the first embodiment.

Figure 13A:
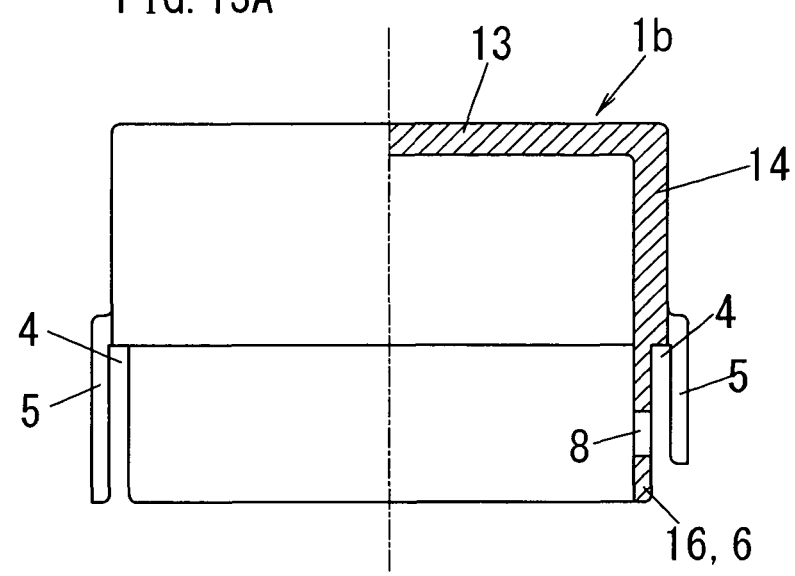
FIGS. 13A and 13B illustrate an embodiment, and are a partial exploded view of a second half, and a partial exploded view of a first half, respectively.
Figure 13B:
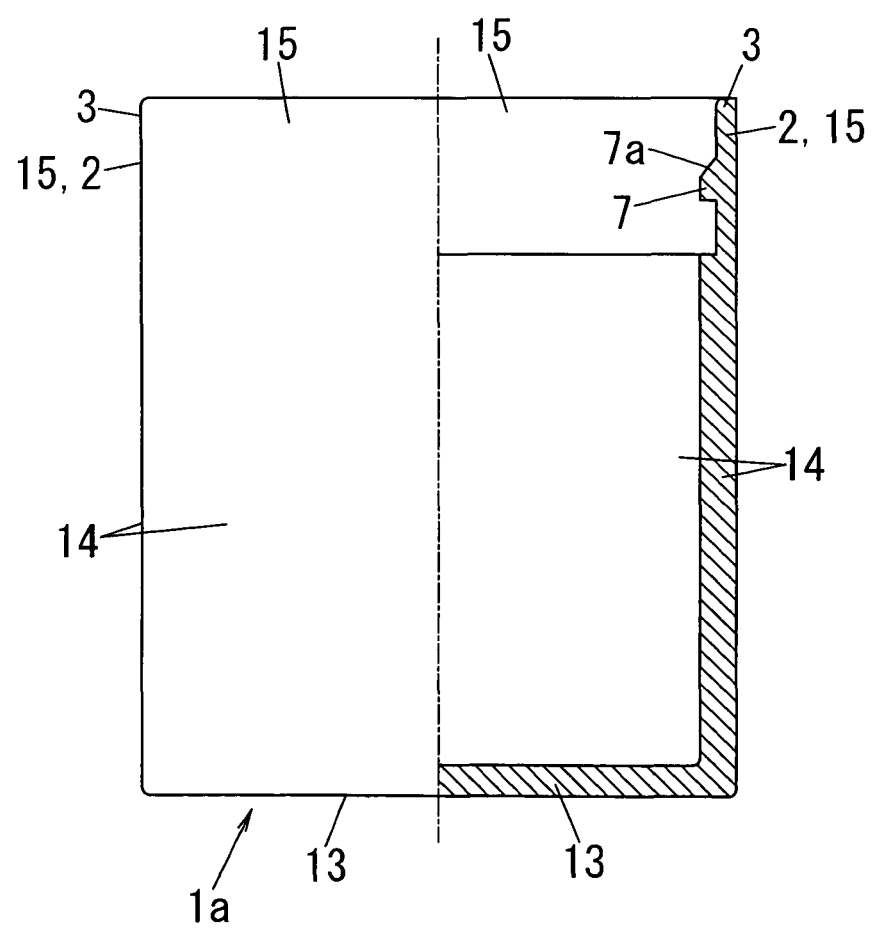
Figure 14:
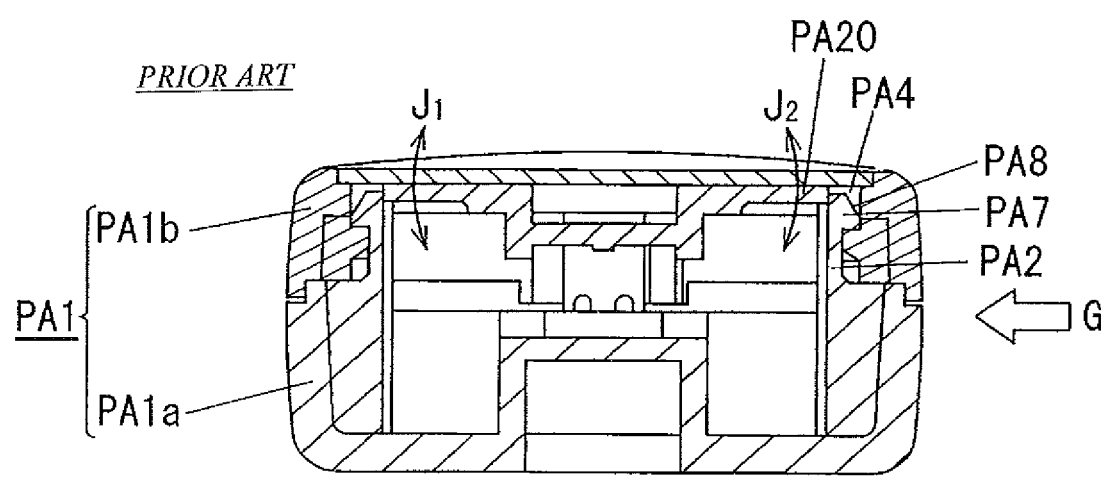
FIG. 14 is a sectional view of a housing of a prior art.

In an embodiment, as shown in FIGS. 13A and 13B, each fit projection piece (2) of the first half (1a) is provided with a pair of nails (7), and each engaging piece (6) of the second half (1b) is provided with a pair of nail holders (8). The pair of nails (7) is formed on the inner face of each fit projection piece (2). Each presser piece (5) is located outside each engaging piece (6). The functions and advantages like the first embodiment can be also expected in this structure.

Although the present invention has been described with reference to certain preferred embodiments, numerous modifications and variations can be made by those skilled in the art without departing from the true spirit and scope of this invention.

The invention claimed is:

1. Fit structure of a housing formed of two halves, wherein:
   a first half of the halves comprises a fit projection piece formed to stick out towards a second half of the halves, said fit projection piece having a fit tongue at a tip; and
   the second half comprises a presser part and an engaging piece between which a fit groove towards the first half is formed,
   wherein the fit projection piece, the presser part and the engaging piece are formed so that the fit tongue of the fit projection piece is positioned in the inner part of the fit groove along a root of the presser part when the fit projection piece is fit in the fit groove,
   wherein the housing further comprises: a nail stuck out in an inward or outward direction with respect to the housing; and a nail holder engaged with the nail,
   the nail and nail holder being located at one and the other of a part of the fit projection piece and a corresponding part of the engaging piece, said part of the fit projection piece being nearer to a root of the fit projection piece than the fit tongue,
   wherein the second half has a rectangular side; and
   the presser part comprises a rectangular presser piece located at an end of the rectangular side,
   wherein the nearer a position on a tip of the presser piece is to the edge of the end of the rectangular side, the longer a projection length of the tip of the presser piece becomes.

2. The fit structure of the housing of claim 1, wherein the nearer a position of a cross-sectional area of the presser part is to the bottom of the fit groove, the larger the cross-sectional area becomes.

3. The fit structure of the housing of claim 1, wherein the presser part is a rectangular presser piece, the width of the presser piece being substantially the same as that of the engaging parts of the nail and nail holder.

* * * * *